United States Patent [19]
Hasegawa et al.

[11] Patent Number: 5,834,767
[45] Date of Patent: Nov. 10, 1998

[54] SURFACE POSITION DETECTING SYSTEM AND PROJECTION EXPOSURE APPARATUS USING THE SAME

[75] Inventors: Masanobu Hasegawa, Utsunomiya; Minoru Yoshii, Tokyo; Kyoichi Miyazaki, Utsunomiya, all of Japan

[73] Assignee: Canon Kabushiki Kaisha, Tokyo, Japan

[21] Appl. No.: 790,798

[22] Filed: Jan. 30, 1997

[30] Foreign Application Priority Data

Feb. 2, 1996 [JP] Japan .................................. 8-040468

[51] Int. Cl.⁶ .................................................. G01B 11/00
[52] U.S. Cl. ...................... 250/237 G; 250/548; 356/374
[58] Field of Search ............................... 250/237 G, 548, 250/559.29; 356/373, 374

[56] References Cited

U.S. PATENT DOCUMENTS 5,610,719  3/1997  Allen et al. ........................ 250/237 G
5,633,721  5/1997  Mizutani ................................. 250/548

FOREIGN PATENT DOCUMENTS 6-283403  10/1994  Japan .

*Primary Examiner*—Edward P. Westin
*Assistant Examiner*—Kevin Pyo
*Attorney, Agent, or Firm*—Fitzpatrick, Cella, Harper & Scinto

[57] ABSTRACT

A detecting system for detecting a surface position of an object, includes a light source, a first grating having a light collecting function, wherein the first grating is illuminated with light from the light source, a second grating having a light collecting function, a first optical system for imaging the first grating onto the object in a direction oblique to the surface of the object, a second optical system for re-imaging the image of the first grating, on the surface of the object, onto the second grating, wherein a moire fringe is produced by the second grating and the re-imaged image of the first grating, and a photodetector for detecting a position of a converged point of convergent light as produced by the moire fringe, wherein the surface position information of the object is determined on the basis of information related to the converged point position as detected by the photodetector.

12 Claims, 8 Drawing Sheets

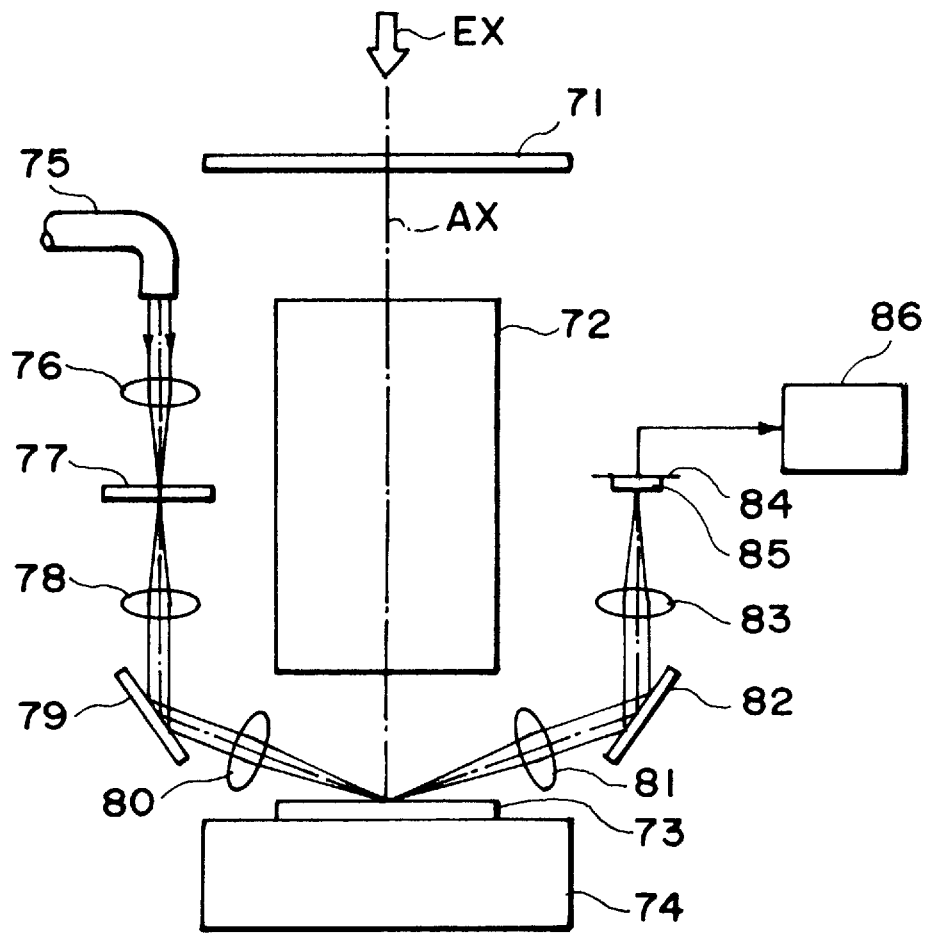
F I G. 1

FIG. 5A
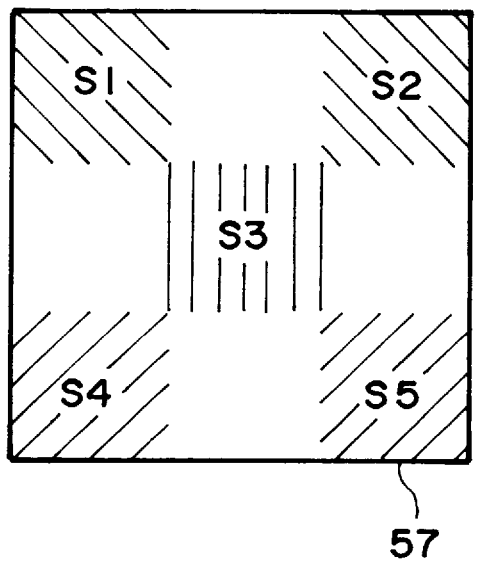
FIG. 5B
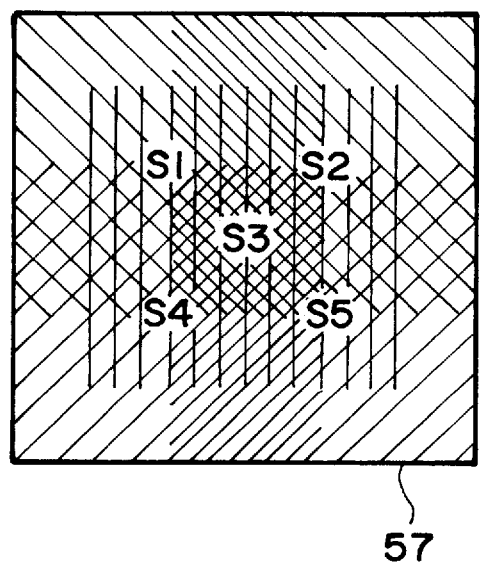
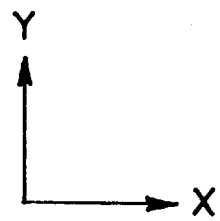

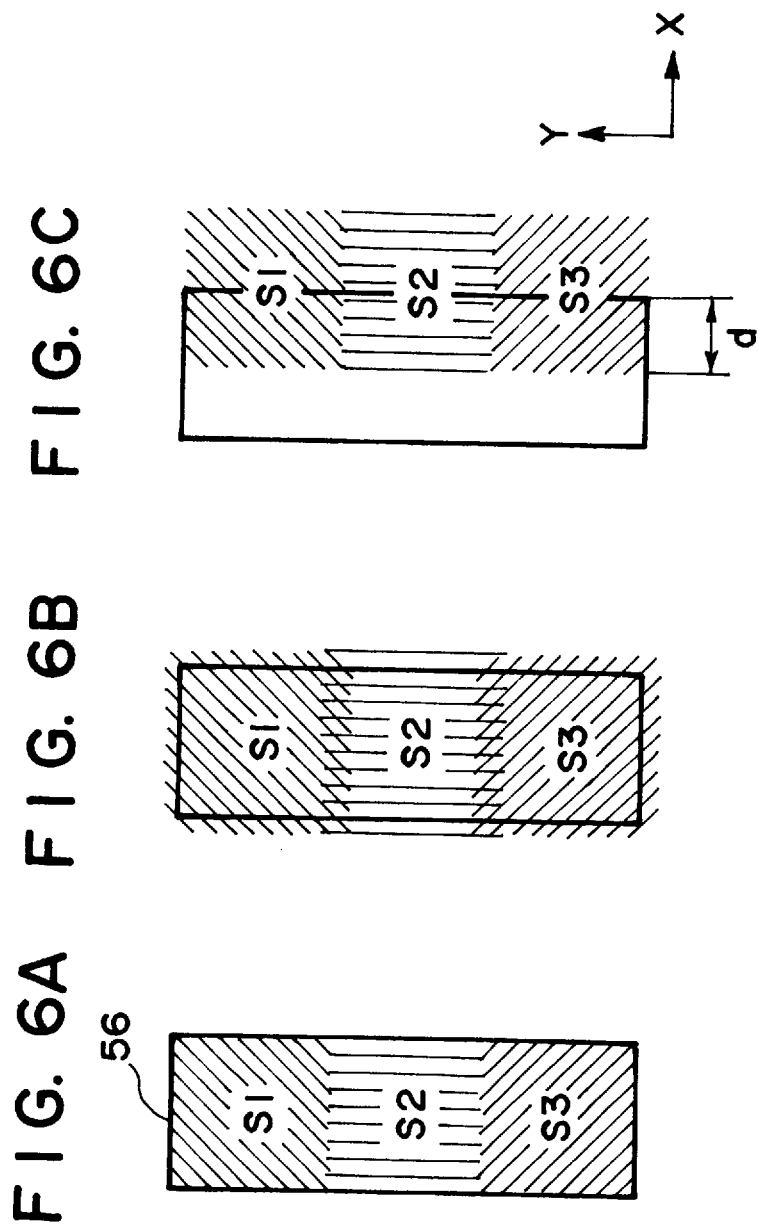

SURFACE POSITION DETECTING SYSTEM AND PROJECTION EXPOSURE APPARATUS USING THE SAME

FIELD OF THE INVENTION AND RELATED ART

This invention relates to a surface position detecting system and, in another aspect, to a projection exposure apparatus or a device manufacturing method using the same. Specifically, the invention is suitably applicable, in projection printing of a fine electronic circuit pattern formed on the surface of a reticle (mask) such as an IC or LSI pattern onto the surface of a wafer with a projection lens (projection optical system), for detecting the surface position information of the wafer such as tilt of or surface position of the wafer surface with respect to the direction of an optical axis of the projection lens, on the basis of which information the wafer is positioned at the best imaging plane of the projection optical system, whereby high density devices are manufactured.

In reduction projection type exposure apparatuses for the manufacture of semiconductor devices, a circuit pattern of a reticle (first object) is projected by a projection lens system onto a wafer (second object) whereby the pattern is printed on the wafer. Here, prior to such projection exposure, the position of the wafer surface with respect to the direction of an optical axis is detected by using a surface position detecting system, for positioning of the wafer surface at the best imaging plane of the projection lens.

An example of such a surface position detecting system is an oblique projection type wherein illumination light is projected obliquely to the surface of a semiconductor wafer placed at the position where a mask pattern is to be transferred by a projection lens, and wherein the surface position of the semiconductor wafer is detected by detecting reflection light being reflected obliquely from the wafer surface.

FIG. 1 is a schematic view of such a surface position detecting system. The illustrated example is a case where the system is applied to an exposure apparatus wherein a pattern of a reticle 71 is projected onto a wafer 73 through a projection lens 72.

In the drawing, illumination light from an optical fiber 75 goes through a condensing lens 76 and illuminates a pattern plate 77 having a pattern. The light passing through the pattern of the plate 77 goes via a lens 78, a mirror 79 and an irradiation objective lens 80, whereby an image of the pattern is projected on the surface of the wafer 73 to be exposed. Here, on the surface of the wafer 73 to be exposed, an image of the pattern formed on the plate 77 is projected and imaged in a direction oblique to the optical axis AX of the projection lens 72. The illumination light reflected by the wafer 73 goes via a condensing objective lens 81, a mirror 82 and an imaging lens 83 and it is received by a light receiving surface 85 of a photoreceptor 84. Here, on the light receiving surface 85 of the photoreceptor 84, an image of the pattern of the plate 77 is formed again (re-imaged). If the wafer 73 shifts upwardly or downwardly (in an optical axis AX direction), the image of the pattern displaces leftwardly or rightwardly along the light receiving surface 84. The position of the pattern is calculated by means of an operation circuit 86, by which the surface position of the wafer 73 with respect to the optical axis AX direction is detected.

In the surface position detecting system of the type shown in FIG. 1, the image of the pattern projected on the wafer 73 has a finite size. If the wafer surface within the range in which the pattern is being projected has locally varying reflectivity, the gravity center of a light quantity of the pattern on the light receiving surface 85 shifts accordingly. This leads to a detection error in the surface position detection to the wafer 73. In order to reduce such an error, the pattern image may be reduced in size. However, since the surface of the wafer 73 is not flat, reducing the pattern image size too much may cause a problem that the reflection light is eclipsed by the light reception N.A. (numerical aperture) of the imaging lens 83, which ends in the failure of detection of reflection light from the pattern image.

Japanese Laid-Open Patent Application, Laid-Open No. 283403/1994 proposes a multi-point measurement for reducing detection error factors by an averaging effect. However, projecting images of a pattern onto the whole area to be measured and disposing photoreceptors of a number corresponding to the number of the images, is practically very difficult.

SUMMARY OF THE INVENTION

It is an object of the present invention to provide a surface position detecting system by which surface position information can be detected easily and with good precision, without being affected by reflectivity non-uniformness or surface shape of an object to be inspected.

It is another object of the present invention to provide an exposure apparatus or a device manufacturing method, which uses the surface position detecting system described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of a surface position detecting system of a known type.

FIGS. 5A and 5B are schematic views, respectively, each for explaining the disposition of measurement points in a case which the invention is applied to a step-and-repeat type exposure apparatus.

FIGS. 6A, 6B and 6C are schematic views, respectively, each for explaining the disposition of measurement points in a case which the invention is applied to a step-and-scan type exposure apparatus.

DESCRIPTION OF THE PREFERRED EMBODIMENTS

Figure 2:
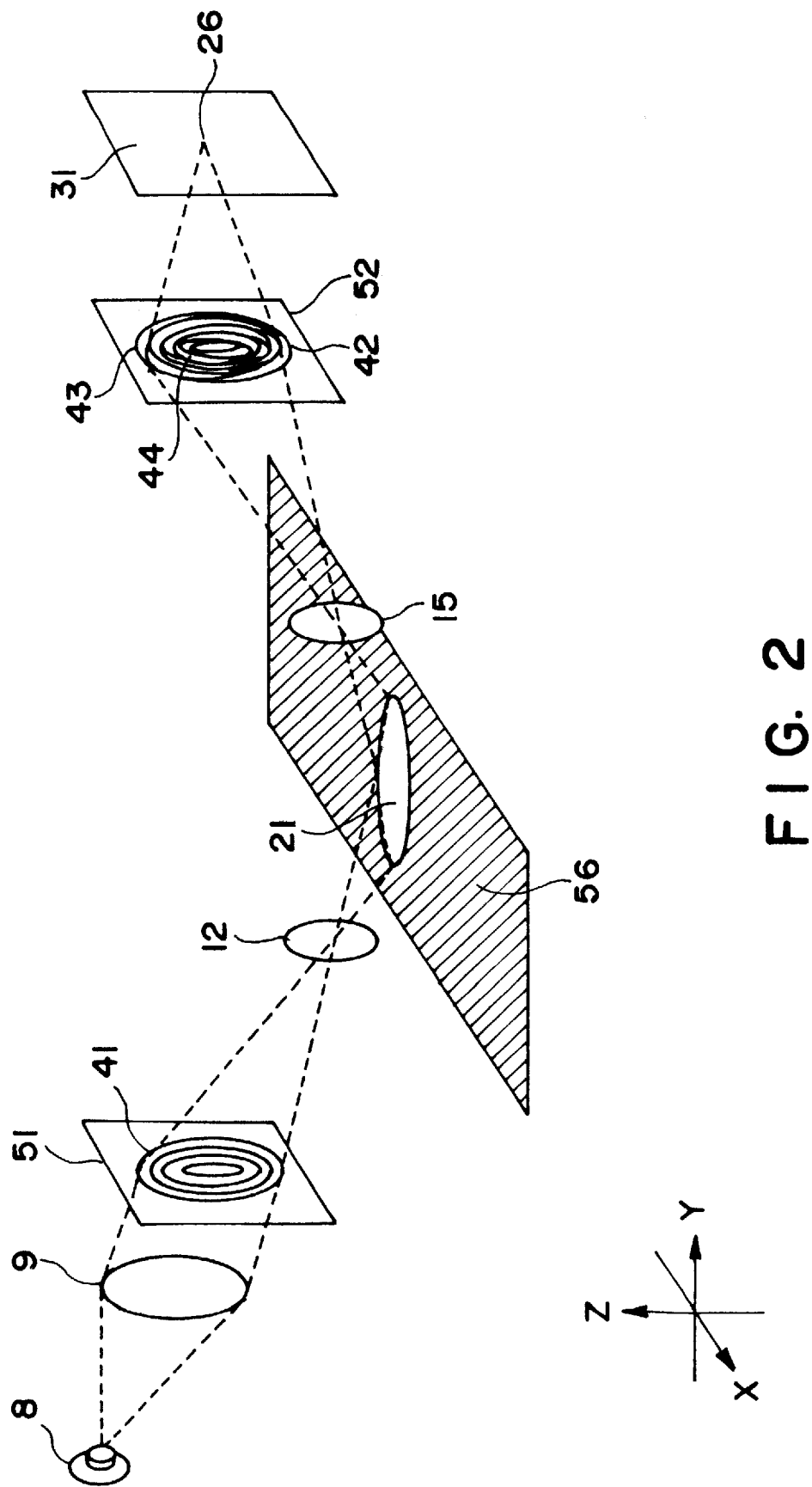
FIG. 2 is a schematic and perspective view of a main portion of a surface position detecting system according to a first embodiment of the present invention.

FIG. 2 is a schematic and perspective view of a main portion of a surface position detecting system according to a first embodiment of the present invention. This embodiment is applied to a case wherein a wafer for device manufacture is used as an object and surface position information of the surface of the wafer with respect to a direction (Z direction) normal to the wafer surface is detected.

In FIG. 2, light from light source means 8 is transformed by a collimator lens 9 into a parallel light which then illuminates light entrance side pattern plate (first grating) 51 on which a light entrance side Fresnel zone plate (FZP) 41 is formed. The light source means 8 and the collimator lens 9 are components of illumination means. The pattern plate 51 is made of crystal, for example, and the Fresnel zone plate 41 is formed thereon by chromium, for example. The Fresnel zone plate 41 is a light collective Fresnel zone plate having a focal length f1. The Fresnel zone plate 41 and the wafer surface 56 are disposed in an optically conjugate relation with each other with respect to a lens system (imaging element) 12, such that an image of the Fresnel zone plate 41 is projected upon a region 21 of the wafer surface 56.

Denoted at 15 is a lens system (re-imaging element). Denoted at 52 is a light exit side pattern plate (second grating) which comprises a glass plate similar to the pattern plate 51, and a light collective Fresnel zone plate 42 having a focal distance f2 is formed on the surface of the plate 52. An image of the Fresnel zone plate 41 as formed in the region 21 is re-imaged by the lens system 15, as an image 43 of the Fresnel zone plate 43 of the pattern plate 52 which is at a position optically conjugate with the region 21. Both of the Fresnel zone plates 41 and 42 have a two-dimensional light collecting function.

The lens systems 12 and 51 each comprises plural lens elements. Upon the glass plate 52, there is a moire-fringe zone plate 44 which is formed by the functions of the projected Fresnel zone plate image 43 of the entrance side Fresnel zone plate 41 as well as the exit side Fresnel zone plate 42. Denoted at 26 is a point of convergence of light (light spot) formed by the moire-fringe zone plate 44. Denoted at 31 is a surface of a sensor which detects positional information of the light spot 26. When the angle of incidence of light upon the wafer surface 56 is small, in response to a displacement of the wafer surface 56 in a +ΔZ direction (perpendicular to the wafer surface 56), the Fresnel zone plate image 43 of the Fresnel zone plate 41 as projected on the glass plate 52 shifts by about −kΔZ along the glass plate 52 (in the case where the lens system 51 comprises an imaging system with a magnification k). In a wafer conjugate system wherein the wafer surface 56 and the glass plate 52 are placed in an optically conjugate relation with each other, the value "−k" corresponds to the detection magnification for the surface position information of the wafer surface 56.

In this embodiment, the surface position information of the wafer surface 56 is detected on the basis of displacement of the light spot 26 upon the sensor surface 31. Thus, in this embodiment, the value "−kβ" corresponding to the product of it by the magnification β of the moire, is the final detection magnification. The moire magnification β can be calculated from the focal lengths f1 and f2 of the two Fresnel zone plates 41 and 42, as follows:

$$\beta = 1/[1 - f1/f2].$$

For example, if f1=100 mm and f2=102 mm, then β=50. Namely, the position detecting system of this embodiment has an advantage that it attains a detection sensitivity 50 times higher than that of an ordinary surface position detecting system of a wafer conjugate type.

If the lens system 15 comprises a unit-magnification imaging system (k=1), in response to displacement of the wafer surface of +1 micron in the Z direction, the light spot 26 shifts by −50 microns on the sensor surface 31. As for a detector for detecting displacement of the light spot 26, a position detecting sensor such as a CCD or a PSD, for example, may be used. An output signal from the sensor 31 may be used, in a step-and-repeat type semiconductor exposure apparatus, for example, as a correction signal for correction of the level (height) or tilt of a stage, for example. In a step-and-scan type exposure apparatus, it may be used as a target value signal with which the level or tilt may be controlled.

In this embodiment as described above, the surface position information of the wafer surface 56 is detected very precisely on the basis of two Fresnel zone plates 41 and 42. In this embodiment, as regards the light spot 26 on the sensor surface 31, the wafer surface 56 is optically conjugate with a pupil plane. Since, in a wafer conjugate system any non-uniformities of reflectivity of the wafer surface 56 directly leads to non-uniformness of luminance of the light detected, it is difficult in principle to avoid an error in the detection of the level (height) of the wafer surface. In the present embodiment, however, although non-uniformness of reflectivity may occur in the re-imaged Fresnel zone plate image 43 because the wafer surface and the reference pattern surface are conjugate with each other, the position of the light spot 26 finally formed on the sensor 31 surface is represented by the function of only the position of the Fresnel zone plate 43 and the position of the exit side Fresnel zone plate 42, such that in principle it is hardly affected by non-uniformness of reflectivity of the wafer surface Taking the advantages as described into effect, in this embodiment, the surface information of the surface being inspected is synthesized into the positional information of the measurement light spot 26. This means that forming the light spot 26 provides an effect of averaging the influences of reflectivity non-uniformness of the surface being inspected. Thus, there is no need of using slits or sensors of a number corresponding to the number of measurement points such as in the aforementioned Japanese Laid-Open Patent Application, Laid-Open No. 283403/1994. The disposition and arrangement of the measurement system of the surface position detecting system is therefore very easy.

Further, since a signal which is less affected by reflectivity non-uniformness or surface shape of a wafer is projected on the sensor surface 31, there is no necessity of complicated processing for calculation of the surface position detection. It is very advantageous for a surface position detecting system in a step-and-scan type exposure apparatus wherein high speed processing is required.

Figure 3:
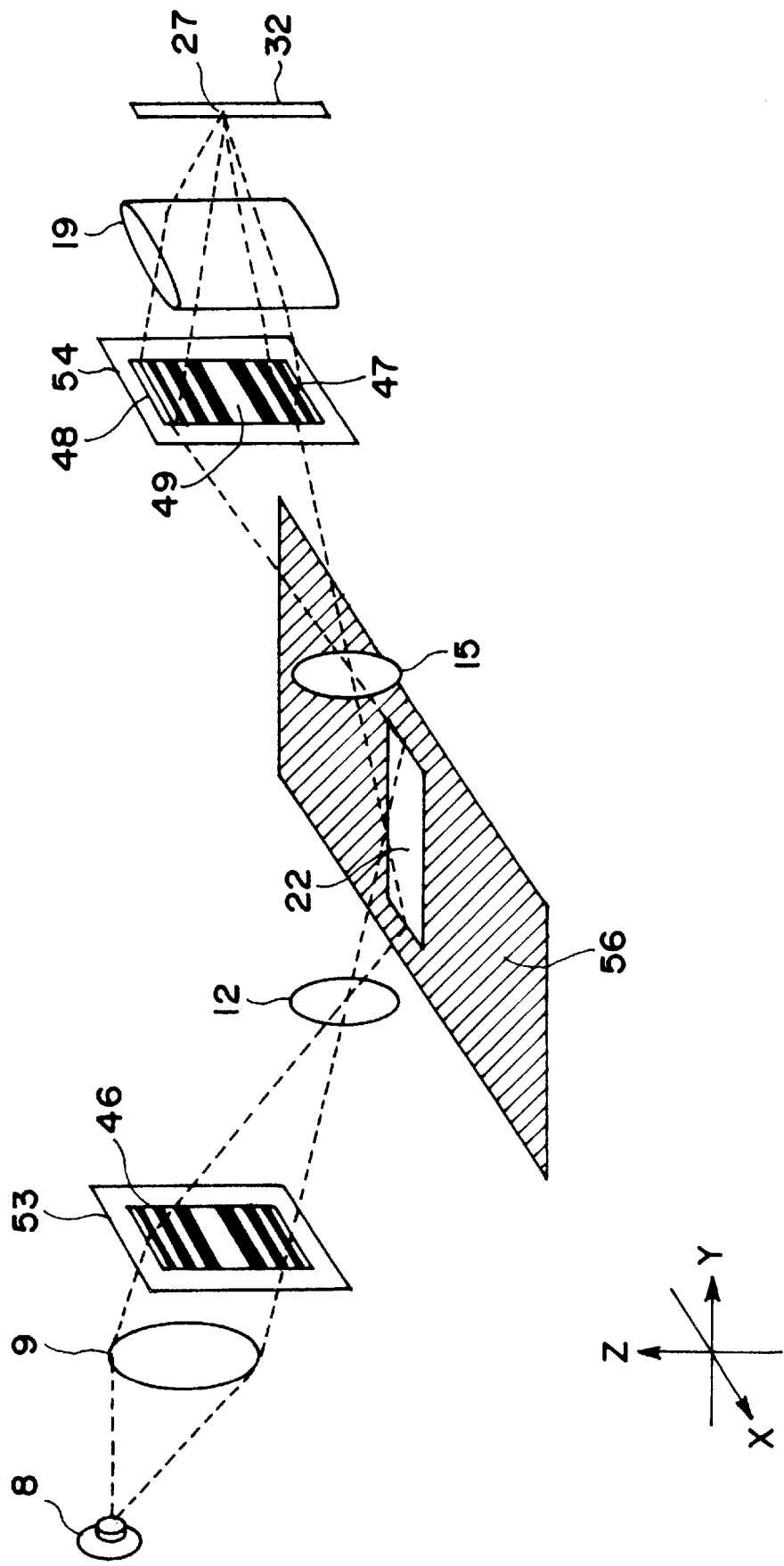
FIG. 3 is a schematic and perspective view of a main portion of a surface position detecting system according to a second embodiment of the present invention.

FIG. 3 is a schematic and perspective view of a main portion of a surface position detecting system according to a second embodiment of the present invention. As compared with the first embodiment of FIG. 2, this embodiment has features that two-dimensional zone plates are replaced by one-dimensional zone plates 46 and 47 having a power only in the Z direction, that a cylindrical lens 19 having a power in the X direction is disposed behind the exit side Fresnel zone plate 47, and that, on the basis of the above, the surface position information of the wafer surface 56 is detected. The principle of detection using a moire fringe, detection magnification and the like are essentially the same as those of the preceding embodiment.

In this embodiment, the level (height) information with respect to X the direction is integrated by means of the lens function of the cylindrical lens 19 and, as a consequence, the average height of a two-dimensional measurement area 22 on the wafer surface 56 is determined as a function of the position of a measurement spot 27 on a line sensor 32. Using one-dimensional Fresnel zone plate members as the Fresnel zone plates 46 and 47 is advantageous in that it is possible to remove sensitivities other than that in the detection direction (Z direction), and that illumination of a rectangular area is easy. Particularly, step-and-scan type exposure apparatuses use an illumination region of exposure light having a shape like a rectangular shape, and the surface position detecting system of the present embodiment is preferable since it provides a detection region of a similar shape.

Figure 4:
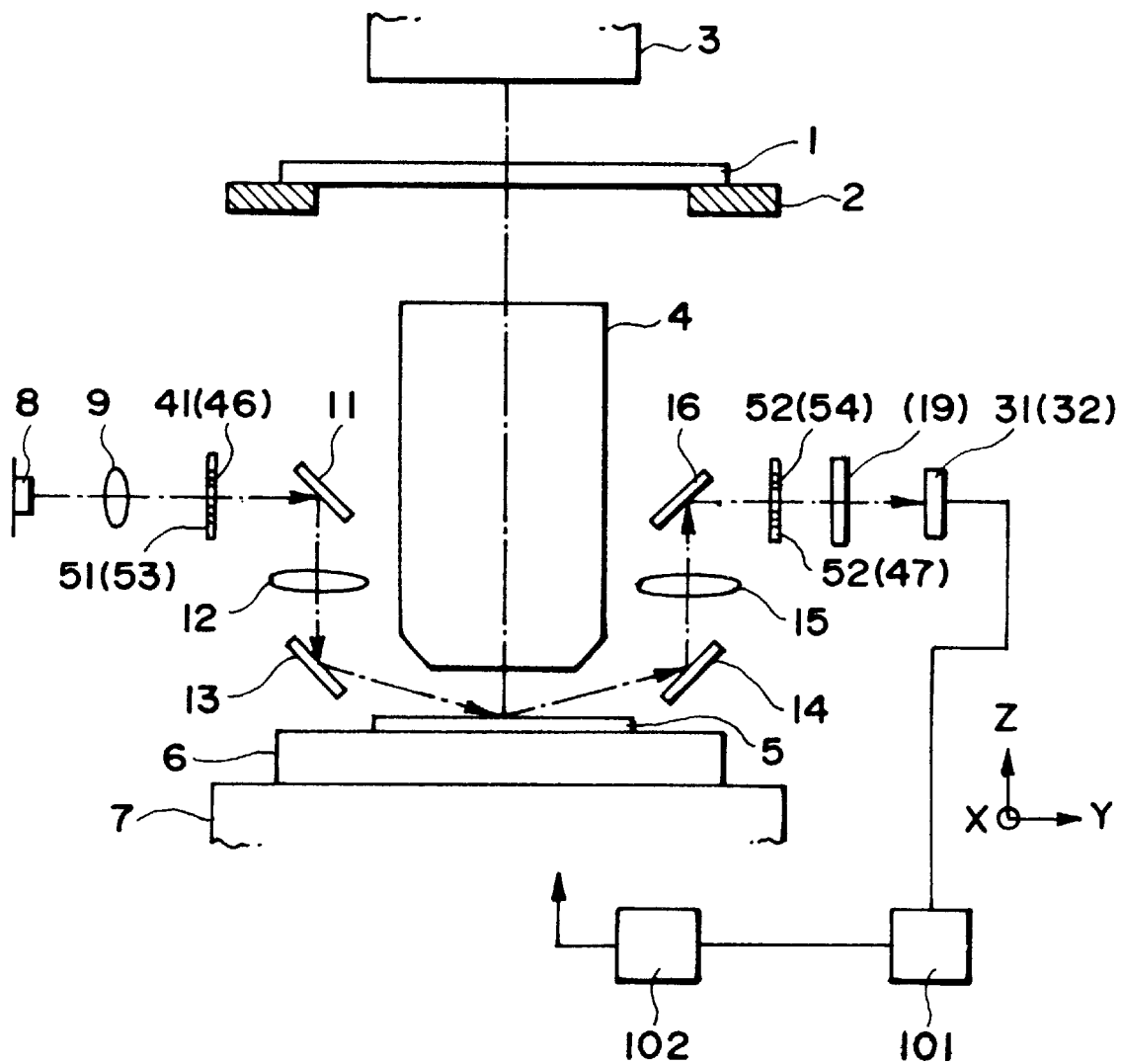
FIG. 4 is a schematic view of a main portion of a surface position detecting system according to a third embodiment of the present invention which is incorporated into a projection exposure apparatus.

FIG. 4 is a schematic view of a main portion of a surface position detecting system according to a third embodiment of the present invention, which is incorporated into a step-and-repeat type or step-and-scan type projection exposure apparatus.

In the drawing, exposure light from an exposure illumination system 3 illuminates a reticle 1 placed on a reticle stage 2, and a circuit pattern formed on the reticle 1 surface is projected sequentially onto the surface of a wafer 5 placed on a wafer chuck 6, through a projection optical system 4 in accordance with a step-and-repeat method or a step-and-scan method. If it is with the step-and-scan method, the reticle stage 2 and (or) the wafer stage 7 are scanningly moved in synchronism with each other in a direction perpendicular to the optical axis direction. The surface position detecting system comprises a structure such as illustrated in FIGS. 2 or 3, and it serves to detect the surface position information of the wafer 5 surface with respect to the optical axis direction (Z direction) in association with a processor 101. On the basis of the detection, the processor 101 controls driving means 102 to move an X-Y-Z stage 7 so that the wafer 5 is positioned at the best imaging plane of the projection optical system 4.

The surface position detecting system comprises the structure such as illustrated in FIGS. 2 or 3. That is, light from illumination means including a light source means 8 and a collimator lens 9, illuminates a pattern plate 51 (53) and a Fresnel zone plate 41 (46). Lens system 12 serves to image the Fresnel zone plate 41 (46) upon the wafer 5 surface, through mirrors 11 and 13 and in an oblique direction to the wafer surface. Lens system 15 serves to re-image the image of the Fresnel zone plate 41 (46) formed on the wafer surface 5, upon a Fresnel zone plate 52 (47) through a mirror 14 in an oblique direction thereto. By this, a moire fringe is formed. Sensor 31 (32) serves to detect the position of a light spot as formed by the moire fringe. Cylindrical lens 19 is disposed in the light path, when one-dimensional Fresnel zone plates are used for the zone plates 46 and 47.

With the above-described arrangement, in the present embodiment, the surface position information of the wafer 5 with respect to the optical axis direction (Z direction) is detected in accordance with the principle of surface position detection as has been described with reference to FIGS. 2 or 3.

FIGS. 5A and 5B are schematic views, respectively, for explaining examples of detection zones S1–S5 for detection of surface position information in relation to an exposure region 57 which is on the surface of a wafer, when the invention is applied to a step-and-repeat type projection exposure apparatus.

The detection region of this embodiment is wider than that of ordinary slit-image projection detection systems. This embodiment uses five surface position detecting systems each being such as described hereinbefore and each performing surface position detection in a corresponding detection zone. The final surface position detection is based on calculation of an average of five points. Also, detection of any tilt wx in the X direction is carried out on the basis of a comparison of the outputs from zones S1 and S2 with the outputs from zones S4 and S5. Detection of any tilt wy in the Y direction is performed on the basis of a comparison of the outputs from zones S1 and S4 with the outputs from zones S2 and S5. Each measurement area may be further expanded such as illustrated in FIG. 5B so that the measurement zones overlap with each other.

FIGS. 6A–6C are schematic views, respectively, for explaining examples of detection zones S1–S3 for surface position detection in relation to an exposure region 56 which is on the surface of a wafer, when the invention is applied to a step-and-scan type projection exposure apparatus.

This embodiment uses three surface position detecting systems each being such as described hereinbefore and each performing surface position detection in a corresponding detection zone. In the case of a step-and-scan type projection exposure apparatus as in this example, the exposure region 56 has a rectangular shape. Thus, the surface position detection is performed with respect to a rectangular region. The surface position detection is based of calculation of an average of the three zones S1–S3. Measurement of any tilt wx in the X direction is based on a comparison between the zones S1 and S2. As regards tilt wy in the Y direction, since it is automatically compensated for by controlling the surface position in the scan direction (the X direction in this example), no particular operation is made in this example. FIG. 6B shows an example wherein measurement zones of the FIG. 6A example are defined so that they partially overlap with each other. FIG. 6C shows an example wherein, when there is a delay between autofocus (AF) measurement and control of the stage to a desired height and/or tilt, the AF measurement points are determined with a shift corresponding to a distance d by which the stage moves in that delay. In this example, the stage moves in positive X direction.

In FIGS. 5A and 5B or in the FIGS. 6A–6C, there are five or three measurement points. The number and placement of the measurement points may vary in accordance with what is required. Also, although in the above-described examples, the surface position information is determined on the basis of a calculation of an average of values at different measurement points, in cases wherein the exposure image plane is not flat, for example, the wafer surface position may be adjusted onto the best imaging plane while taking the values at the different measurement points into account.

While in the foregoing embodiments the invention has been described with reference to a reduction type projection exposure apparatus, the present invention is applicable also to exposure apparatuses of types other than that shown in FIG. 4, such as, for example, an apparatus wherein a pattern image is projected by a projection mirror system or an apparatus wherein a pattern image is projected by a projection optical system having lenses and mirrors. Further, the present invention is also applicable to exposure apparatuses other than an optical exposure apparatus, such as, for example, an electron beam exposure apparatus wherein a circuit pattern is drawn or projected by using an electron beam and electron lenses, or an X-ray exposure apparatus. Moreover, the present invention is also applicable to optical instruments, other than exposure apparatus, wherein surface position detection is necessary.

Next, a semiconductor device manufacturing method according to an embodiment of the present invention, which uses a projection exposure apparatus such as described hereinbefore, will be explained.

Figure 7:
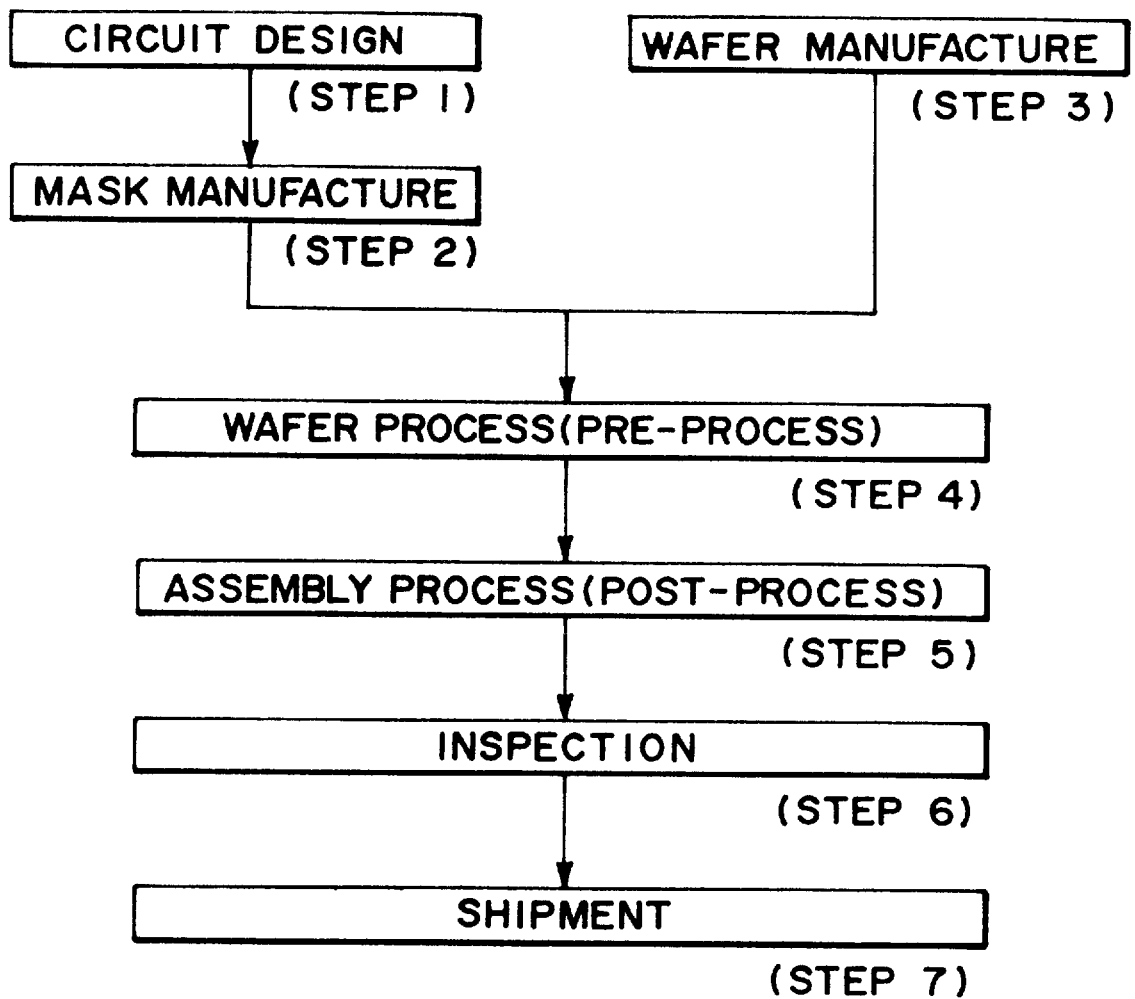
FIG. 7 is a flow chart of device manufacturing processes according to an embodiment of the present invention.

FIG. 7 is a flow chart of the sequence of manufacturing a semiconductor device such as a semiconductor chip (e.g., an IC or an LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 8:
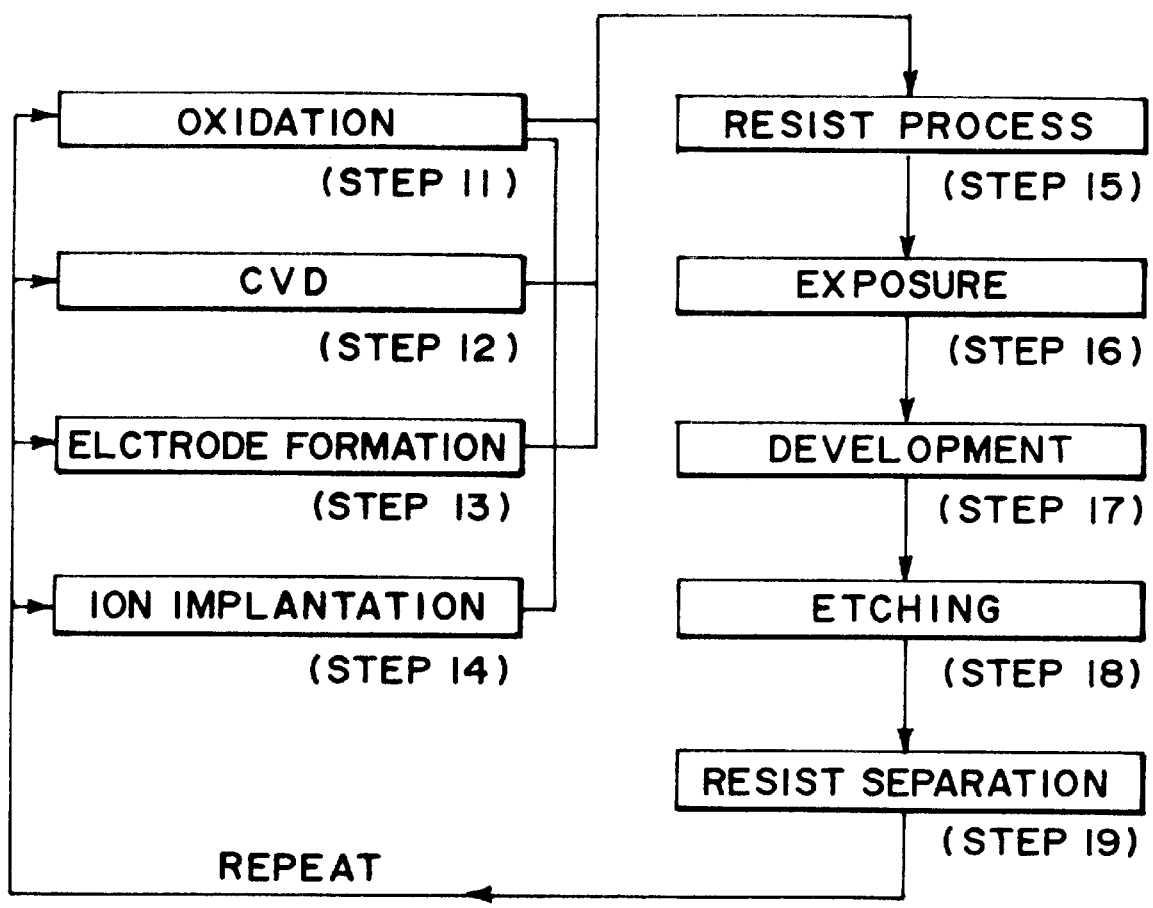
FIG. 8 is a flow chart of a wafer process in the flow of FIG. 7.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the resist-applied wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The method of the present invention according to this embodiment facilitates production of high density semiconductor devices.

For detection of surface position information of the surface of an object in accordance with an oblique illumination method, the components of projection means for projecting a predetermined pattern onto the surface of the object in an oblique direction as well as the components of re-imaging means for re-imaging the projected pattern on the object upon a predetermined plane may be set appropriately, as described, by which a surface position detecting system which enables high precision and easy detection of surface position information without being affected by reflectivity non-uniformness or surface shape of the object, is assured. Also, a device manufacturing method using the same is assured.

Particularly, an image of a first zone plate formed on an entrance side pattern plate and having a first focal length may be projected on the surface of a wafer, and an image thereof may again be projected on a second zone plate which is formed on an exit side pattern plate and having a second focal length. Then, the position of a light convergence point or spot of a moire-fringe zone plate, as produced by the image of the first zone plate and by the second zone plate, may be detected, by which a surface position detecting system which enables high speed processing without being affected by reflectivity non-uniformness or surface shape of the wafer is accomplished.

While the invention has been described with reference to the structures disclosed herein, it is not confined to the details set forth and this application is intended to cover such modifications or changes as may come within the purposes of the improvements or the scope of the following claims.

What is claimed is:

1. A detecting system for detecting a surface position of an object, comprising:
    a light source;
    a first grating having a light collecting function, wherein said first grating is illuminated with light from said light source;
    a second grating having a light collecting function;
    a first optical system for imaging said first grating onto the object in a direction oblique to the surface of the object;
    a second optical system for re-imaging the image of said first grating, on the surface of the object, onto said second grating, wherein a moire fringe is produced by said second grating and the re-imaged image of said first grating; and
    a photodetector for detecting a position of a converged point of convergent light as produced by the moire fringe, wherein the surface position information of the object is determined on the basis of information related to the converged point position as detected by said photodetector.

2. A system according to claim 1, wherein each of said first and second gratings comprises a Fresnel zone plate.

3. A system according to claim 2, wherein said first and second gratings have different focal lengths.

4. A system according to claim 2, wherein each of said first and second gratings comprises a two-dimensional Fresnel zone plate.

5. A system according to claim 2, wherein each of said first and second gratings comprises a one-dimensional Fresnel zone plate.

6. A projection exposure apparatus, comprising:
    a projection exposure system for projecting a pattern of a first object onto a second object;
    a light source;
    a first grating having a light collecting function, wherein said first grating is illuminated with light from said light source;
    a second grating having a light collecting function;
    a first optical system for imaging said first grating onto the object in a direction oblique to the surface of the object;
    a second optical system for re-imaging the image of said first grating, on the surface of the object, onto said second grating, wherein a moire fringe is produced by said second grating and the re-imaged image of said first grating;
    a photodetector for detecting a position of a converged point of convergent light as produced by the moire fringe; and
    an adjusting system for adjusting the position of the surface of the second object with respect to a direction of an optical axis of said projection exposure system, on the basis of the detection by said photodetector.

7. An apparatus according to claim 6, wherein each of said first and second gratings comprises a Fresnel zone plate.

8. An apparatus according to claim 7, wherein said first and second gratings have different focal lengths.

9. An apparatus according to claim 7, wherein each of said first and second gratings comprises a two-dimensional Fresnel zone plate.

10. An apparatus according to claim 7, wherein each of said first and second gratings comprises a one-dimensional Fresnel zone plate.

11. A projection exposure apparatus, comprising:

a projection exposure system for projecting a pattern of a first object onto a second object;

at least one surface position detecting system for detecting a position of the surface of the second object with respect to a direction of an optical axis of said projection exposure system, said at least one surface position detecting system including (i) a light source, (ii) a first grating having a light collecting function, wherein said first grating is illuminated with light from said light source, (iii) a second grating having a light collecting function, (iv) a first optical system for imaging said first grating onto the object in a direction oblique to the surface of the object, (v) a second optical system for re-imaging the image of said first grating, on the surface of the object, onto said second grating, wherein a moire fringe is produced by said second grating and the re-imaged image of said first grating, and (vi) a photodetector for detecting a position of a converged point of convergent light as produced by the moire fringe, wherein the surface position information of the object is determined on the basis of information related to the converged point position as detected by said photodetector; and a position adjusting system for adjusting the position of the surface of the second object with respect to the direction of the optical axis of said projection exposure system, on the basis of the detection by said position detecting system.

12. A device manufacturing method which includes projecting and printing a pattern of a first object onto a second object by using a projection exposure apparatus as recited in claim 6 or claim 11.

* * * * *

UNITED STATES PATENT AND TRADEMARK OFFICE
CERTIFICATE OF CORRECTION

PATENT NO. : 5,834,767

DATED : November 10, 1998

INVENTORS : MASANOBU HASEGAWA, ET AL.

It is certified that error appears in the above-identified patent and that said Letters Patent is hereby corrected as shown below:

IN THE DRAWINGS

In FIG. 8, in Step 13, "ELCTRODE" should read --ELECTRODE--.

COLUMN 2:

line 52, "which" should read --in which--; and
line 56, "which" should read --in which--.

UNITED STATES PATENT AND TRADEMARK OFFICE
CERTIFICATE OF CORRECTION

PATENT NO. : 5,834,767

DATED : November 10, 1998

INVENTORS : MASANOBU HASEGAWA, ET AL.

It is certified that error appears in the above-identified patent and that said Letters Patent is hereby corrected as shown below:

COLUMN 4:

```
line 20, "system" should read --system,--;
line 34, "as described" should read --described--; and
line 67, "X the" should read --the X--.
```

Signed and Sealed this

Twentieth Day of July, 1999

Attest:

Q. TODD DICKINSON

*Attesting Officer*  *Acting Commissioner of Patents and Trademarks*